US008214179B2

(12) United States Patent
Carlbom et al.

(10) Patent No.: US 8,214,179 B2
(45) Date of Patent: *Jul. 3, 2012

(54) ACOUSTIC MODELING APPARATUS AND METHOD USING ACCELERATED BEAM TRACING TECHNIQUES

(75) Inventors: Ingrid B. Carlbom, Union, NJ (US); Thomas A. Funkhouser, Mercer, NJ (US)

(73) Assignee: Agere Systems Inc., Allentown, PA (US)

( * ) Notice: Subject to any disclaimer, the term of this patent is extended or adjusted under 35 U.S.C. 154(b) by 1546 days.

This patent is subject to a terminal disclaimer.

(21) Appl. No.: 11/561,368

(22) Filed: Nov. 17, 2006

(65) Prior Publication Data

US 2007/0294061 A1 Dec. 20, 2007

Related U.S. Application Data

(63) Continuation of application No. 09/634,764, filed on Aug. 7, 2000, now Pat. No. 7,146,296.

(60) Provisional application No. 60/147,662, filed on Aug. 6, 1999.

(51) Int. Cl.
*G06F 17/50* (2006.01)
*H03G 3/00* (2006.01)

(52) U.S. Cl. .................. 703/2; 703/17; 700/94; 381/61; 381/63

(58) Field of Classification Search .................. 703/2, 5, 703/17; 381/63, 70, 61, 62; 715/727; 700/94; 455/423, 457
See application file for complete search history.

(56) References Cited

U.S. PATENT DOCUMENTS

| | | | | | |
|---|---|---|---|---|---|
| 4,103,551 | A | * | 8/1978 | Lynnworth | 73/861.27 |
| 5,467,401 | A | | 11/1995 | Nagamitsu et al. | |
| 5,491,644 | A | | 2/1996 | Pickering et al. | |
| 5,574,466 | A | | 11/1996 | Reed et al. | |
| 5,715,412 | A | | 2/1998 | Aritsuka et al. | |
| 5,771,041 | A | * | 6/1998 | Small | 715/727 |
| 5,784,467 | A | | 7/1998 | Asayama | |
| 5,963,459 | A | | 10/1999 | Burnett et al. | |
| 6,343,131 | B1 | | 1/2002 | Huopaniemi | |
| 6,751,322 | B1 | * | 6/2004 | Carlbom et al. | 381/63 |
| 7,146,296 | B1 | * | 12/2006 | Carlbom et al. | 703/5 |

OTHER PUBLICATIONS

Thomas Funkhouser, et al.; "A Beam Tracing Approach to Acoustic Modeling for Interactive Virtual Environments"; Computer Graphics (SIGGRAPH '98); Orlando, FL, Jul. 1998, pp. 1-12.

* cited by examiner

*Primary Examiner* — Thai Phan

(57) ABSTRACT

An acoustic modeling system and an acoustic modeling method use beam tracing techniques that accelerate computation of significant acoustic reverberation paths in a distributed virtual environment. The acoustic modeling system and method perform a priority-driven beam tracing to construct a beam tree data structure representing "early" reverberation paths between avatar locations by performing a best-first traversal of a cell adjacency graph that represents the virtual environment. To further accelerate reverberation path computations, the acoustic modeling system and method according to one embodiment perform a bi-directional beam tracing algorithm that combines sets of beams traced from pairs of avatar locations to efficiently find viable acoustic reverberation paths.

30 Claims, 13 Drawing Sheets

ACOUSTIC MODELING APPARATUS AND METHOD USING ACCELERATED BEAM TRACING TECHNIQUES

CROSS REFERENCE TO RELATED APPLICATION

This application is a continuation of U.S. patent application Ser. No. 09/634,764, entitled "ACOUSTIC MODELING APPARATUS AND METHOD USING ACCELERATED BEAM TRACING TECHNIQUES," filed on Aug. 7, 2000, by Ingrid B. Carlbom, et al., which has issued as U.S. Pat. No. 7,146,296. The above-listed patent is commonly assigned with the present invention and is incorporated herein by reference as if reproduced herein in its entirety.

U.S. Pat. No. 7,146,296 claims priority under 35 U.S.C. §119(e) of U.S. Provisional application 60/147,662 filed on Aug. 6, 1999, the entire contents of which are incorporated herein by reference. U.S. Pat. No. 7,146,296 is related to U.S. Application that names the same inventors, titled "Acoustic Modeling Apparatus and Method for Virtual Environments," the entire contents of which are incorporated herein by reference.

TECHNICAL FIELD OF THE INVENTION

The present invention relates to an apparatus and a method for modeling acoustics, and more particularly to an apparatus and a method for modeling acoustics in a virtual environment.

BACKGROUND OF THE INVENTION

Multi-user virtual environment systems incorporate computer graphics, sound, and optionally networking to simulate the experience of real-time interaction between multiple users who are represented by avatars in a shared three-dimensional (3D) virtual world. A multi-user system allows a user to "explore" information and "interact" with other users in the context of a virtual environment by rendering images and sounds of the environment in real-time while the user's avatar moves through the 3D environment interactively. Example applications for multi-user systems include collaborative design, distributed training, teleconferencing, and multi-player games.

A difficult challenge for implementing a multi-user system is rendering realistic sounds that are spatialized according to the virtual environment in real-time for each user. Sound waves originating at a source location travel through the environment along a multitude of reverberation paths, representing different sequences of acoustic reflections, transmissions, and diffractions.

FIG. 1 illustrates, in 2D, just some of the possible acoustic reverberation paths between a sound source S and a receiver R in a simple two-room environment. The different arrival times and amplitudes of sound waves traveling along possible reverberation paths provide important auditory cues for localization of objects, separation of simultaneous speakers (i.e., the "cocktail party effect"), and sense of presence in the virtual environment. Because sound generally travels between a source and a receiver along a large number of paths, via reflection, transmission, and diffraction, realistic accurate acoustic simulation, particularly when sound sources and receivers are moving, is extremely computationally expensive.

One known acoustic modeling approach, known as beam tracing, classifies reverberation paths originating from a source position by recursively tracing pyramidal beams (i.e., a set of rays) through space. More specifically, a set of pyramidal beams is constructed that completely covers the two-dimensional (2D) space of directions from the source. For each beam, polygons that represent surfaces in the virtual space (e.g., walls, windows, doors, etc.) are considered for intersection in front-to-back order from the source. As intersecting polygons are detected, the original beam is "clipped" to remove the shadow region created by the intersecting polygon, a transmission beam is constructed matching the shadow region, and a specular reflection beam is constructed by mirroring the transmission beam over the intersecting polygon's plane.

FIGS. 2 and 3 illustrate, in 2D, these general principles of a beam tracing technique. In FIG. 2, a specular reflection beam $R_a$ is constructed by mirroring a transmission beam over surface a, using S' as a virtual beam source. The transmission beam $T_a$ is constructed to match the shadow region created by surface a. Since each beam represents the region of space for which a corresponding virtual source (at the apex of the beam) is visible, high order virtual sources must be considered only for reflections off polygons intersecting the beam. For instance, referring to FIG. 3, consider the virtual source $S_a$ which results from the specular reflection of the beam originating from S over polygon a. The corresponding reflection beam, $R_a$, intersects exactly the set of polygons (c and d) for which second-order reflections are possible after specular reflection off polygon a. Other polygons (b, e, f, and g) need not be considered for second-order reflections after a, thus significantly pruning the recursion tree of virtual sources.

A significant disadvantage of conventional beam tracing techniques, however, is that the geometric operations which are required to trace beams through the virtual environment (i.e., computing intersections, clipping, and mirroring) are computationally expensive, particularly when the source and/or the receiver are/is moving. Because each beam may be reflected and/or obstructed by several surfaces, particularly in complex environments, it is difficult to perform the necessary geometric operations on beams efficiently as they are recursively traced through the spatial environment. Generally, current acoustic modeling techniques are "off-line" systems which compute reverberation paths for a small set of pre-specified source and receiver locations, and allow interactive evaluation only for pre-computed results. Unfortunately, it is usually not possible to store pre-computed impulse responses or reverberation paths over all possible avatar locations for use by a multi-user system because the storage requirements of this approach would be prohibitive for all cases except very simple environments or very coarse samplings.

Significant advances have been made in multi-user systems supporting visual interactions between users in a shared 3D virtual environment. The most common examples of such advancements are multi-player games which display images in real-time with complex global illumination and textures to produce visually compelling and immersive experiences. On the other hand, there has been little progress in realistic acoustic modeling in such virtual environments.

SUMMARY OF THE INVENTION

The present invention is a method and an apparatus for modeling acoustics in a virtual environment that utilizes techniques for accelerating the computation of reverberation paths between source and receiver locations so that sound can be rapidly modeled and auralized, even for moving sources and receivers in complex environments. By using such techniques, the present invention enables a virtual environment that incorporates realistic spatialized sound for real-time communication between multiple users.

According to one implementation of the present invention, an input spatial model is represented as a set of partitioned convex polyhedral (cells). Pairs of neighboring cells that share at least one polygonal boundary are linked to form a cell adjacency graph. For each sound source, convex pyramidal beams are traced through the spatial model via a priority-driven technique so that the beams representing the most significant reverberation paths between avatar locations, i.e., those that arrive early at a receiver location, are given priority during tracing, thereby increasing processing efficiency. Insignificant reverberation paths, e.g., late-arriving reverberations for which the human brain is less sensitive, may be modeled by statistical approximations.

During priority-driven beam tracing, a beam tree data structure is generated to represent the regions of space reached by each traced beam. This beam tree data structure includes nodes that each store: 1) a reference to the cell being traversed, 2) the cell boundary most recently traversed, and 3) the convex beam representing the region of space reachable by the sequence of reverberation events (e.g., a sequence of reflections, transmissions, and diffractions) along the current reverberation path. Each node of the beam tree also stores the cumulative attenuation due to the sequence of reverberation events (e.g., due to reflective, transmissive, and diffractive absorption).

The priority-driven beam tracing technique of the present invention considers beams in best-first order by assigning relative priorities, represented as priority values stored in a priority queue, to different beam tree leaf nodes. As a beam tree is constructed, priority values for the beam tree leaf nodes are stored in the priority queue and the highest priority node is iteratively selected for expansion at each step. In one specific implementation of the present invention, higher priority is given to beam tree nodes representing potentially shorter reverberation paths. The primary advantage of priority-driven beam tracing is that it avoids geometric computations for many beams that are part of insignificant reverberation paths, thereby enabling rapid computation of the significant reverberation paths. Using the beam tree data structure to trace paths between avatar positions, accelerated computation rates for updating an acoustic model can be achieved so as to be suitable for virtual environments with moving avatars. According to another embodiment of the present invention, a bi-directional beam tracing technique is utilized to combine beam trees created by tracing beams from two different avatar locations to efficiently find reverberation paths between such two different avatar locations. The primary motivation for bi-directional beam tracing is that the computation complexity of beam tracing typically grows exponentially with increasing reflections. Consequently, tracing one set of beams up to k reflections will normally take far longer than tracing two sets of beams up to k/2 reflections. Furthermore, because acoustic modeling in a multi-user system requires finding reverberation paths between all pairs of avatars unidirectional beam tracing will inherently result in redundancies, with almost every reverberation path being traced twice (once in each direction). With the bi-directional beam tracing approach of the present invention, such redundancies are avoided by combining beams traced from one avatar location with beams traced from one another to find the same reverberation paths more efficiently.

DETAILED DESCRIPTION

The following detailed description relates to an acoustic modeling apparatus and method which utilizes techniques for accelerating the computation of reverberation paths between source and receiver locations to accelerate tracing and evaluating acoustic reverberation paths, thus enabling rapid acoustic modeling for a virtual environment shared by a plurality of users.

System Overview

Figure 1:
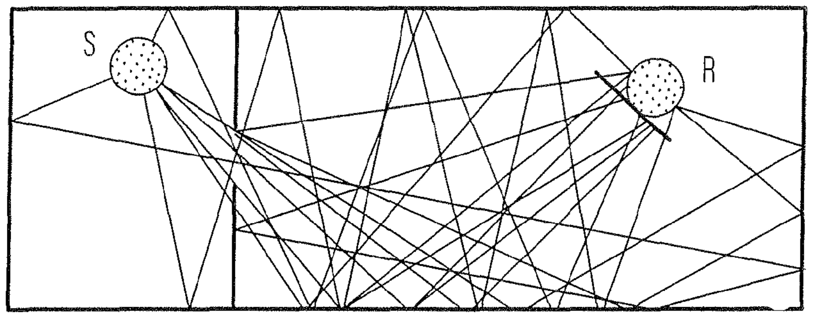
FIG. 1 illustrates numerous reverberation paths between a sound source and a receiver location in a simple spatial model.
Figure 2:
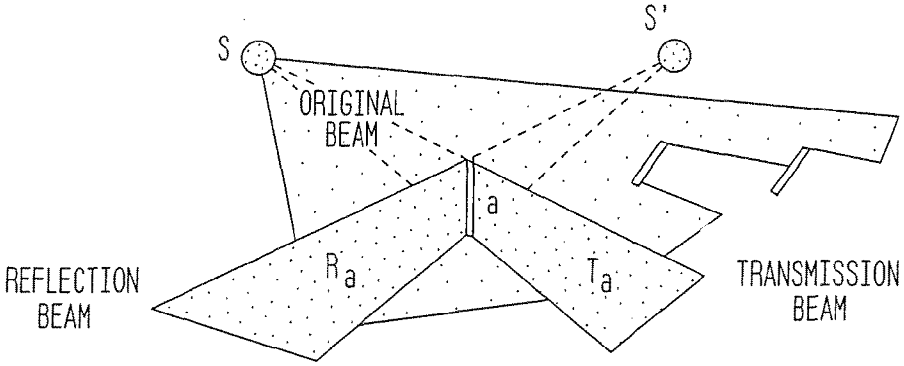
FIG. 2 illustrates general principles of a conventional beam tracing technique for modeling acoustics.
Figure 3:
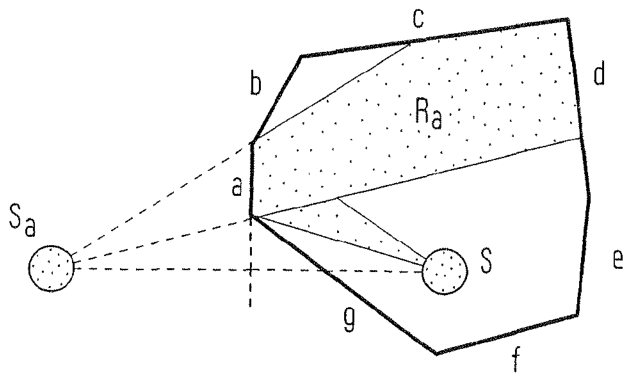
FIG. 3 illustrates general principles of conventional beam tracing using a virtual source to construct a specular reflection beam.
Figure 4:
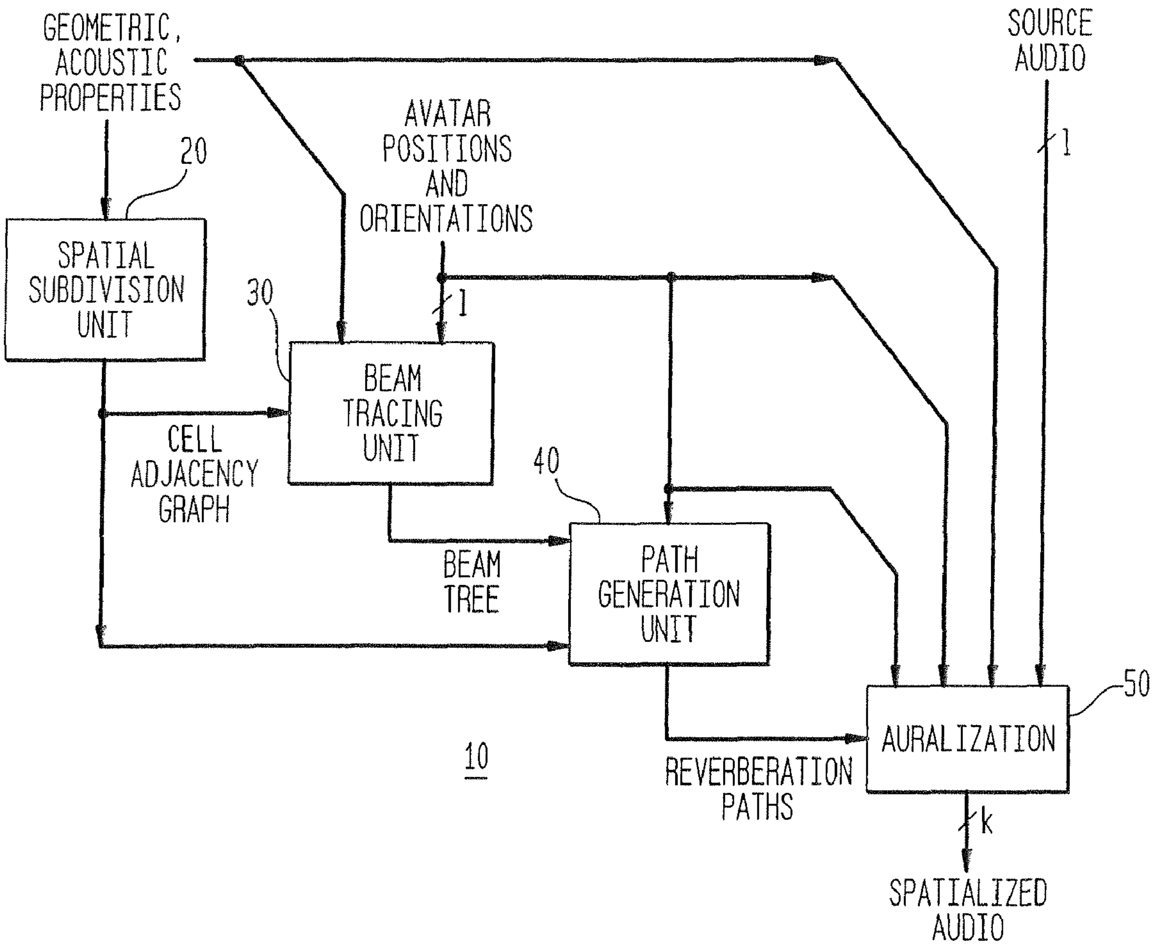
FIG. 4 is an overview of the acoustic modeling system according to an embodiment of the present invention.

FIG. 4 illustrates an acoustic modeling system 10 according to an embodiment of the present invention that includes a spatial subdivision unit 20; a beam tracing unit 30; a path generation unit 40; and an auralization unit 50. It should be recognized that this illustration of the acoustic modeling system 10 as having four discrete elements is for ease of illustration, and that the functions associated with these discrete elements may be performed using a single processor or a combination of processors.

Generally, the acoustic modeling system 10 takes as input: 1) a description of the geometric and acoustic properties of the surfaces in the environment (e.g., a set of polygons with associated acoustic properties), and 2) avatar positions and orientations. As users interactively move through the virtual environment, the acoustic modeling system 10 generates spatialized sound according to the computed reverberation paths between avatar locations.

As will be discussed in greater detail below, the spatial subdivision unit 20 pre-computes the spatial relationships that are inherent in a set of polygons describing a spatial environment. The spatial subdivision unit 20 represents these inherent spatial relationships in a data structure called a cell adjacency graph, which facilitates subsequent beam tracing.

The beam tracing unit 30 iteratively follows acoustic reverberation paths, such as paths of reflection, transmission, and diffraction through the spatial environment via a priority-driven traversal of the cell adjacency graph generated by the spatial subdivision unit 20. While tracing acoustic beam paths through the spatial environment, the beam tracing unit 30 creates beam tree data structures that explicitly encode acoustic beam paths (e.g., as sequence of specular reflection and transmission events) between avatar locations. The beam tracing unit 30 updates each beam tree as avatars move in the virtual environment. According to one embodiment of the present invention, the beam tracing unit 30 generates beam trees for each avatar location using a priority-driven technique to rapidly compute the significant reverberation paths between avatar locations, while avoiding tracing insignificant reverberation paths. According to another embodiment of the present invention, the beam tracing unit 30 avoids tracing redundant beams between avatar locations by using a bin directional beam tracing approach to combine beam trees that are constructed for different avatars locations. The path generation unit 40 uses the beam trees created by the beam tracing unit 30 to recreate significant reverberation paths between avatar locations.

Finally, the auralization unit 50 computes source-receiver impulse responses, which each represent the filter response (e.g., time delay and attenuation) created along reverberation paths from each source point to each receiver. The auralization unit 50 may statistically represent late-arriving reverberations in each source-receiver impulse response. The auralization unit 50 convolves each source-receiver impulse response with a corresponding source audio signal, and outputs resulting signals to the users so that accurately modeled audio signals are continuously updated as users interactively navigate through the virtual environment. The spatialized audio output may be synchronized with real-time graphics output to provide an immersive virtual environment experience.

Spatial Subdivision

As illustrated in FIG. 4, the spatial subdivision unit 20 receives data that geometrically defines the relevant environment (e.g., a series of connected rooms or a building) and acoustic surface properties (e.g., the absorption characteristics of walls and windows). Although the model shown in FIG. 5A is in 2D for ease of illustration, the line segments labeled a-q may represent planar surfaces in 3D, such as walls, and thus are referred to as "polygons" herein to make it clear that the acoustic modeling techniques disclosed herein are applicable to 3D environments.

As mentioned above, the spatial subdivision unit 20 preprocesses the input geometric data to construct a spatial subdivision of the input model, and ultimately generates a cell adjacency graph representing the neighbor relationships between regions of the spatial subdivision. Initially, the spatial subdivision is constructed by partitioning the input model into a set of convex polyhedral regions (cells). FIG. 5B illustrates such a spatial subdivision computed for the input model shown in FIG. 5A.

The spatial subdivision unit 20 builds the spatial subdivision using a. Binary Space Partition (BSP) process. As is well known, BSP is a recursive binary split of 3D space into convex polyhedral regions (cells) separated by plane's. (Fuchs et al., "On Visible Surface Generation by a Priori Tree Structures," *Computer Graphics*, Proc. SIGGRAPH '80, 124-133). The spatial subdivision unit 20 performs BSP by recursively splitting cells along selected candidate planes until no input polygon intersects the interior of any BSP cell. The result is a set of convex polyhedral cells whose convex, planar boundaries contain all the input polygons.

Figure 5A:
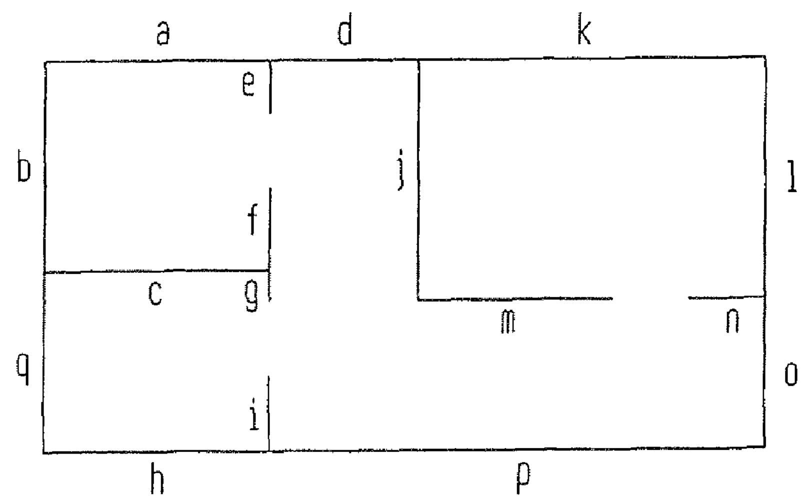
FIG. 5A illustrates an input spatial model used to demonstrate the acoustic modeling techniques of the present invention.
Figure 5B:
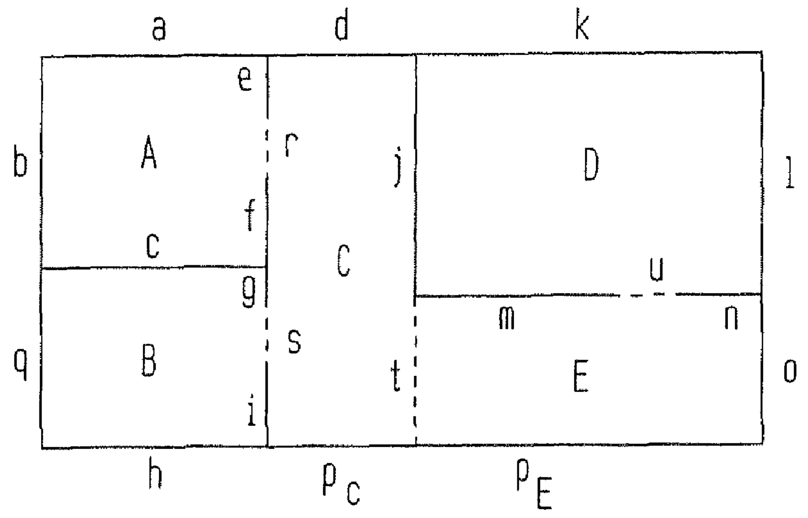
FIG. 5B illustrates a spatial subdivision of the input model of FIG. 5A.

FIG. 5B illustrates a simple 2D spatial subdivision for the input model of FIG. 5A. Input polygons appear as solid line segments labeled with lower-case letters a-q; transparent cell boundaries introduced by the BSP are shown as dashed line segments labeled with lower-case letters r-u; and constructed cell regions are labeled with upper-case letters A-E. As seen in FIG. 5B, a first cell, A, is bound by polygons a, b, c, e, f, and transparent boundary polygon r (e.g., a doorway); a second cell, B, is bound by polygons c, g, h, i, q, and transparent boundary polygon s; a third cell, C, is bound by polygons d, e, f, g, i, j, $p_C$, t, and transparent boundary polygons r, s, t; a fourth cell, D, is bound by polygons j, k, l, m, n; and transparent boundary polygon u; and a fifth cell, E, is bound by polygons m, n, o, $p_E$ and transparent boundary polygons u and t.

Figure 6:
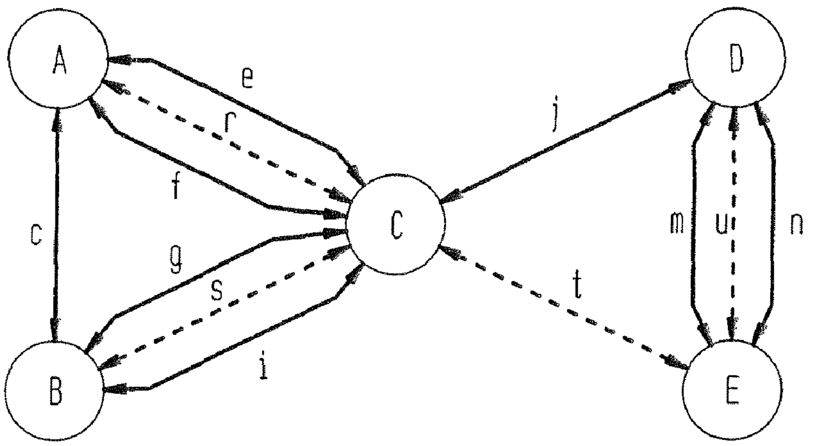
FIG. 6 illustrates a cell adjacency graph constructed for the spatial subdivision shown in FIG. 5B.

The spatial subdivision unit 20 constructs a cell adjacency graph to explicitly represent the neighbor relationships between cells of the spatial subdivision. Each cell of the BSP is represented by a node in the graph, and two nodes have a link between them for each planar, polygonal boundary shared by the corresponding adjacent cells in the spatial subdivision. As shown in FIG. 5B, cell space A neighbors cell B along polygon c, and further neighbors cell C along polygons e, f, and transparent polygon r. Cell B neighbors cell C along polygons g, i, and transparent polygon s. Cell C neighbors cell D along polygon j, and further neighbors cell E along transparent boundary polygon t. Cell D neighbors cell E along polygons m, n, and transparent polygon u. This neighbor relationship between cells A-E is stored in the form of the cell adjacency graph shown in FIG. 6, in which a solid line connecting two cell nodes represents a shared opaque polygon, while a dashed line connecting two cell nodes represents a shared transparent boundary polygon.

Construction of the cell adjacency graph may be integrated with the BSP algorithm. In other words, when a region in the BSP is split into two regions, new nodes in the cell adjacency graph are created corresponding to the new cells, and links are updated to reflect new adjacencies. A separate link is created between two cells for each convex polygonal region that is either entirely transparent or entirely opaque.

It should be recognized that alternative data structures may be used to represent the neighbor relationships between cells of the spatial subdivision. For example, a data structure that explicitly identifies diffractive boundary edges may be used to facilitate tracing diffractive beams.

Priority-Driven Beam Tracing

Figure 7:
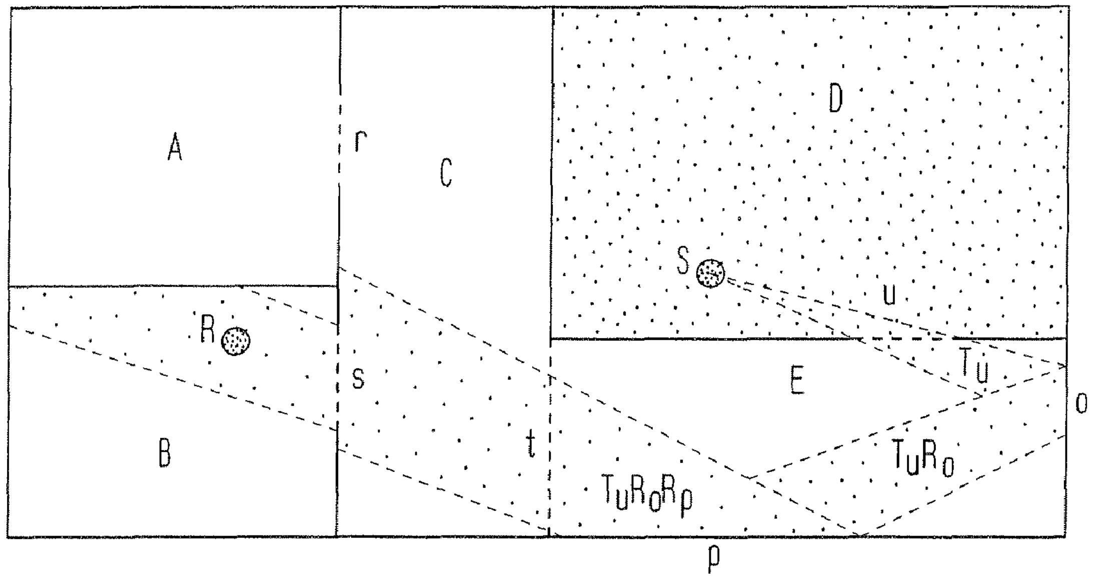
FIG. 7 illustrates a series of specular reflection and transmission beams traced from a source location to a receiver location in the input model of FIG. 5A.

The beam tracing technique utilized by the beam tracing unit 30 according to the present invention iteratively follows reverberation paths that include specular reflections and transmissions. Depending on the complexity of the virtual environment, the number of avatars, and computing resources, the beam tracing unit 30 may also consider other acoustic phenomena such as diffuse reflections and diffractions when constructing the beam tree for each avatar. FIG. 7 illustrates a single significant reverberation path between a source, S, and a receiver, R, that includes a series of transmissions and specular reflections through the spatial environment of FIG. 5A. More specifically, the significant reverberation path between S and R shown in FIG. 7 includes a transmission through the transparent boundary u, resulting in beam, $T_u$, that is trimmed as it enters cell E through the transparent boundary u. $T_u$ intersects only polygon o as it passes through cell E, which results in a specular reflection beam $T_uR_o$. Specular reflection beam $T_uR_o$ intersects only polygon p, which spawns reflection beams $T_uR_oR_p$. Finally reflection beam $T_uR_oR_p$ will transmit through transparent boundaries t and s to reach receiver R in cell B. The beam tracing unit 30 accelerates this iterative process by accessing the cell adjacency graph generated by the spatial subdivision unit 20 and using the relationships encoded in the cell adjacency graph to accelerate acoustic beam tracing through the spatial subdivision.

Figure 8A:
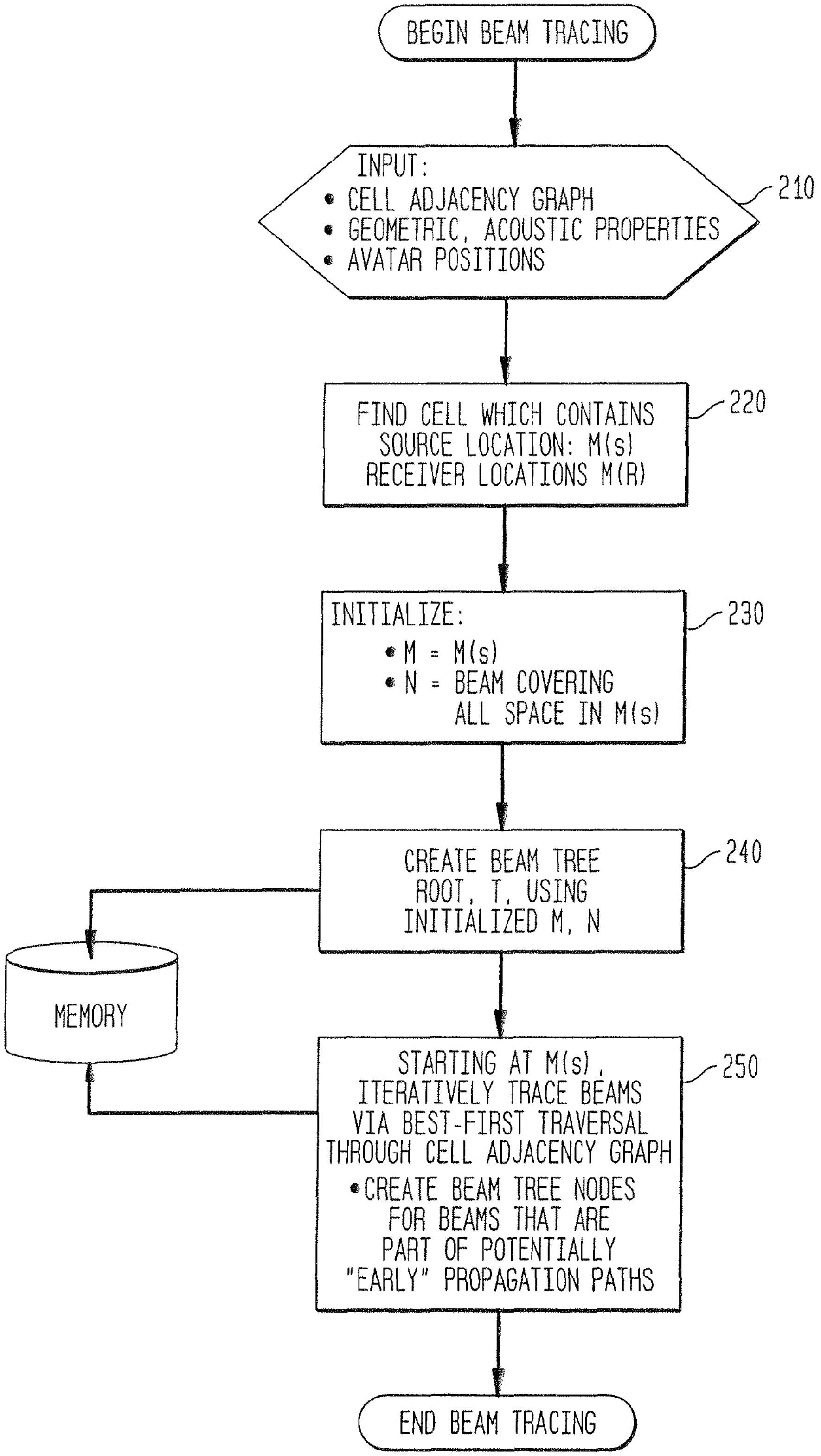
FIG. 8A is a high-level flowchart for priority-driven beam tracing according to an embodiment of the present invention.

The beam tracing method according to the present invention will be described with reference to the spatial division shown in FIG. 5B, the flow diagrams of FIGS. 8A and 8B, the partial beam tree shown in FIG. 9, and the exemplary priority value calculation illustrated in FIG. 10.

According to an embodiment of the present invention, the beam tracing unit 30 utilities a priority-driven beam tracing technique that exploits knowledge of avatar locations to efficiently compute only the significant reverberation paths between such avatar locations. In other words, the priority-driven beam tracing technique considers beams representing acoustic propagation events in best-first order. As the beam tracing unit 30 constructs a beam tree date structure for a particular sound source to represent reverberation paths between that sound source and other avatar locations, priority values for leaf nodes are stored in a priority queue, and the highest priority leaf node is iteratively selected for expansion at each step. The primary advantage of the priority-driven beam technique described herein is that it avoids geometric computations for many beams representing insignificant reverberation paths, and therefore is able to compute the significant reverberation paths more rapidly. Furthermore, because most significant beams will be considered first, adaptive refinement and dynamic termination criteria can be used.

One issue for implementing the priority-driven beam tracing techniques generally described above is how to assign relative priorities to different beam tree leaf nodes. To discriminate between high-priority and low-priority beam tree nodes, reverberation paths are partitioned into two categories: (1) early reverberations; and (2) late reverberations. Early reverberations are defined as those arriving at the receiver within some short amount of time, Te, while late reverberations are defined as those arriving at the receiver some time after Te (e.g., 20 ms≦Te≦80 ms). To achieve a realistic representation of sound between avatars, only early-arriving propagation paths generally need to be calculated, while late reverberations can be modeled with statistical approximations. According to the present invention, higher priority is assigned to beam tree nodes representing potentially shorter (i.e., early arriving) reverberation paths.

Another issue for implementing the priority-driven beam tracing technique according to an embodiment of the present invention is how to guide the priority-driven beam tracing process to find early reverberation paths efficiently. As one way to guide the priority-driven beam tracing, a priority value f(B) of each beam tree node, B, is calculated. An exemplary way to calculate f(B) is to add the length of the propagation path from the source to the last traversed cell boundary, g(B), and the length from the last traversed cell boundary to the closet avatar location, h(B). In other words, f(B)=g(B)+h(B). FIG. 10 generally illustrates this calculation of f(B). Since f(B) underestimates the length of any path through node B to an avatar, it is assured that all early reverberation paths are found if beam tracing is terminated when the value of f(B) for all nodes remaining in the priority queue corresponds to an arrival time of at least Te later than the most direct possible path to every avatar location.

Next, a specific technique for priority-driven beam tracing will be described with reverence to the flow diagrams of FIGS. 8A and 8B, by which the beam tracing unit 30 traces beam paths through the input spatial subdivision via a priority-driven traversal of the cell adjacency graph, starting in the cell containing a source point, and creates a beam tree for each source point. The beam tracing unit 30 first accesses the cell adjacency graph generated by the spatial subdivision unit 20, the geometric and acoustic properties of the input spatial model, and the position of each avatar (step 210).

At step 220, the beam tracing unit 30 searches the spatial subdivision of the input model to find the cell, M(S), that contains source S and further to find the cell(s), M(R), of each potential receiver R. Throughout the priority-driven traversal of the cell adjacency graph, the beam tracing unit 30 maintains a current cell M, (as a reference to a cell in the spatial subdivision) and a current beam N (an infinite convex pyramidal beam whose apex is the actual source point or a virtual source point). At step 230, current cell M is initialized as M(S), and current beam N is initialized as the beam covering all space in M(S).

As discussed above, the goal of the beam tracing unit 30 is to generate a beam tree data structure that encodes significant reverberation event sequences originating from an audio source location. The beam tree unit 30 creates the root of the beam tree at step 240 using the initialized values of current cell M and current beam N, and stores the beam tree root data in memory.

Next, at step 250, the beam tracing unit 30 iteratively traces beams, starting in the cell M(S), via a best-first traversal of the cell adjacent graph. Cells of the spatial environment are visited recursively while beams representing the regions of space reached from the source by sequences of propagation events, such as specular reflections and transmissions (as well as diffuse reflections and diffractions if desired), are incrementally updated. As cell boundaries are traversed into new cell, the current convex pyramidal beam is "clipped" to include only the region of space passing through the polygonal boundary.

When a boundary polygon P is a transmissive surface, a transmission path will be traced to the cell which neighbors the current cell M across polygon P with a transmission beam constructed as the intersection of current beam N with a pyramidal beam whose apex is the source point (or a virtual source point), and whose sides pass through the edges of P. Likewise, when P is a reflecting input surface, a specular reflection path is followed within current cell M with a specular reflection beam, constructed by mirroring the transmission beam over the plane supporting P. Furthermore, a diffuse reflection path is followed when P is a diffusely reflecting polygon by considering the surface intersected by the impinging beam as a "source" and the region of space reached by the diffuse reflection event as the entire half-space in front of that source. Still further, a diffraction path is followed for boundary edges that intersect current beam N by considering the intersecting edge as a source of new waves so that the resulting diffraction beam corresponds to the entire shadow region from which the edge is visible.

While tracing beams through the spatial subdivision, the beam tracing unit 30 constructs a beam tree data structure corresponding directly to the recursion tree generated during priority-driven traversal of the cell adjacency graph. Each node of the beam tree stores: 1) a reference to the cell being traversed, 2) the cell boundary most recently traversed (if there is one), and 3) the sequence of propagation events along the current propagation path. Each node of the beam tree also stores the cumulative attenuation due to the sequence of reverberation events (e.g., due to reflective, transmissive, and diffractive absorption). To further accelerate subsequent reverberation path generation, each cell of the spatial subdivision stores a list of "back pointers" to its beam tree ancestors.

Figure 8B:
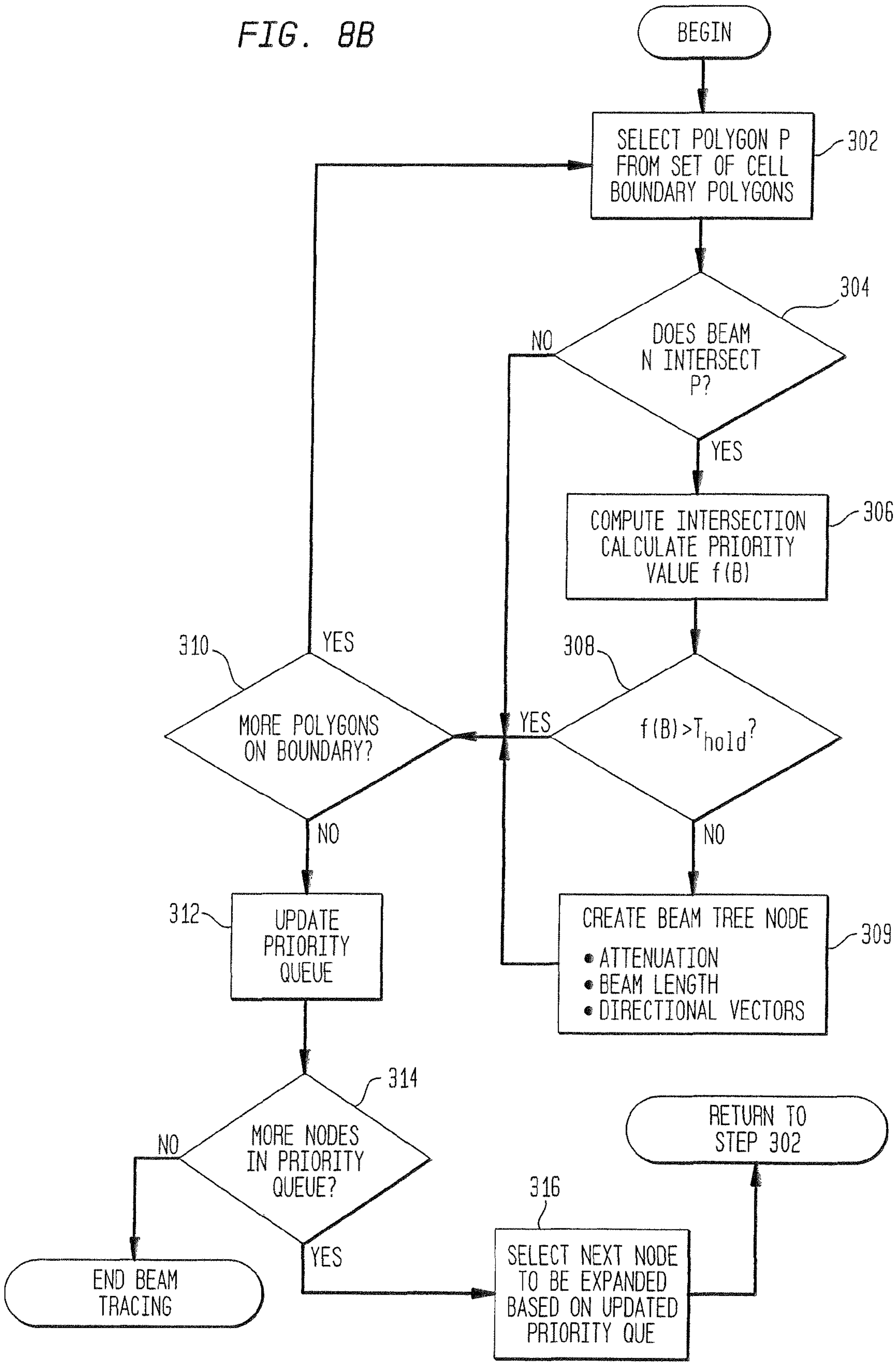
FIG. 8B is a flowchart further illustrating priority-driven beam tracing according to embodiments of the present invention.

The operation of priority-driven beam tracing performed by the beam tracing unit 30 is more particularly illustrated in the flow diagram of FIG. 8B. For considering boundary polygons that may be part of propagation paths between the source and other avatar locations, the beam tracing unit 30 selects a first polygon P of the set of polygons at step 302 which collectively form a boundary around current cell M, and determines at step 304 whether current beam N intersects the selected polygon P. If not, the beam tracing unit 30 determines at step 310 whether all boundary polygons of current cell M have been checked for intersection with current beam N, and if not returns to step 302 to select another boundary polygon. When a selected polygon P intersects current beam N, the beam tracing unit 30 computes the intersection at step 306, and follows the path(s) (e.g., reflection, transmission, or diffraction) created when the current beam N impinges on the polygon P.

When the intersecting polygon P is transmissive, a beam will be traced to the cell adjacent to current cell M with a transmission beam. Likewise, when polygon P is a reflecting input surface, the beam tracing unit 30 will trace a specular reflection beam, created by constructing a mirror of the transmission beam over the plane supporting polygon P. If the beam tracing unit 30 determines at step 304 that current beam N intersects P, the beam tracing unit 30 also calculates a priority value f(B) that represents the priority of the node that corresponds to the resulting beam (step 306). As described above, f(B) may be calculated by adding the length of the shortest path from the source to polygon P and the length of the shortest path from polygon P to the closest avatar location (step 306). Next, at step 308, the beam tracing unit compares f(B) to a threshold, $T_{hold}$. If f(B) is greater than $T_{hold}$, indicating a "late" reverberation path, a beam tree node is not created for the intersection of beam N with polygon P, and the beam tracing unit 30 determines at step 310 whether all boundary polygons of current cell M have been checked for intersection with current beam N. If priority value f(B) is not greater than $T_{hold}$, a beam tree node is created for the intersection of polygon P and current beam N to represent attenuation, beam length, and directional vectors of the corresponding beam path (step 309). After all polygons P from a set of boundary polygons have been checked for intersection with current beam N and priority values, f(B), have been calculated for each intersecting polygon, the priority queue is updated at step 312 so that the beam tracing unit 30 may determine the node of the beam tree to be expanded next.

Next, the beam tracing unit 30 determines at step 314 whether there are more leaf nodes in the priority queue. If not, beam tracing for the source being considered is complete. If more nodes are stored in the priority queue, the highest-priority node is selected at step 316 and the process returns to step 302 to consider each boundary polygon P of the cell corresponding to the selected beam tree node.

Figure 9:
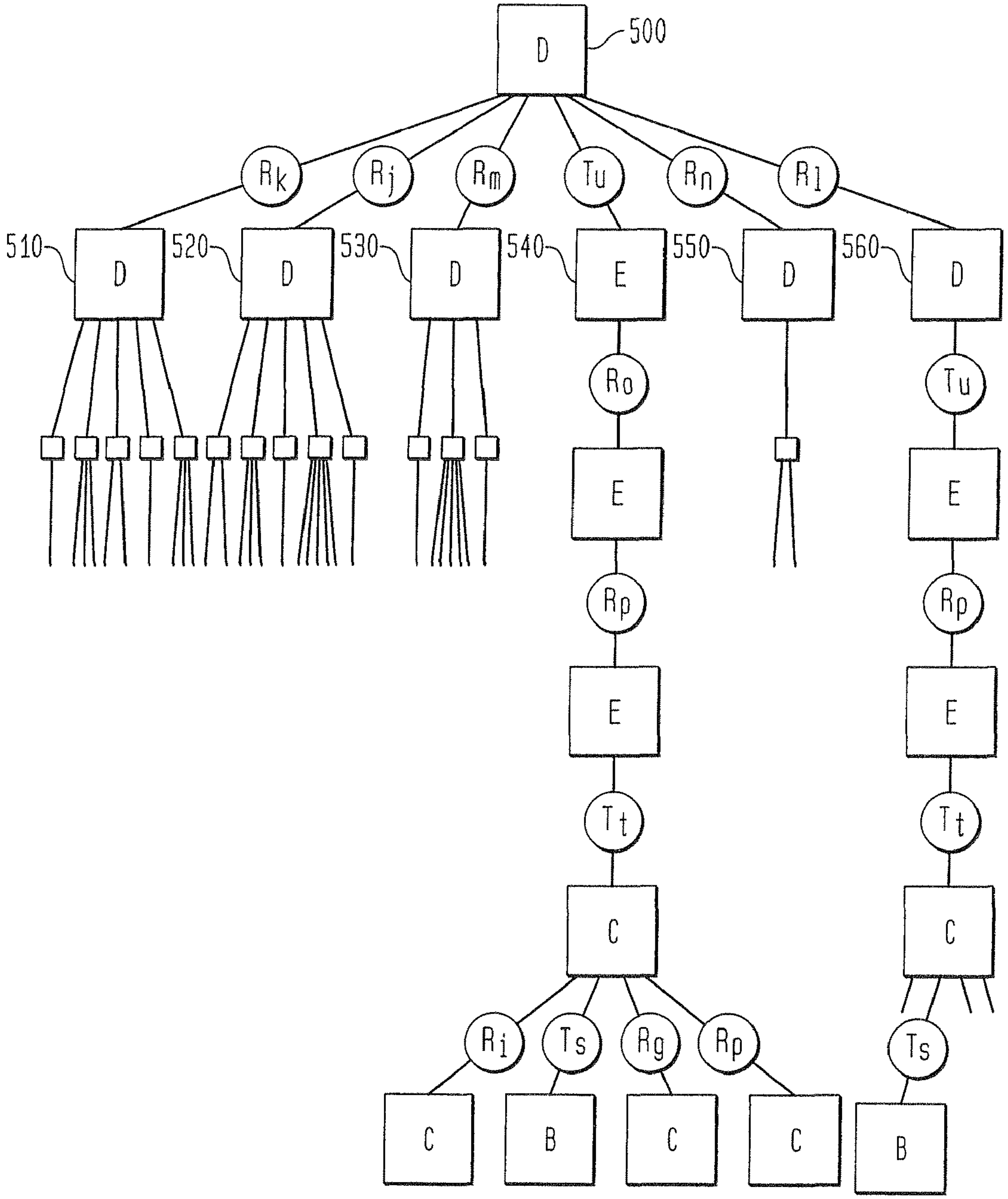
FIG. 9 illustrates a partial beam tree for the space illustrated in FIG. 7 that encodes beam paths of specular reflections and transmissions constructed by priority-driven beam tracing in accordance with an embodiment of the present invention.
Figure 10:
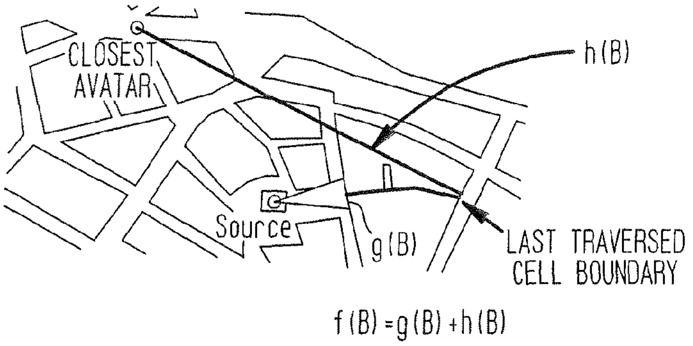
FIG. 10 illustrates principles of assigning priority values to beam tree nodes during priority-driven beam tracing according to an embodiment of the present invention.
Figure 11:
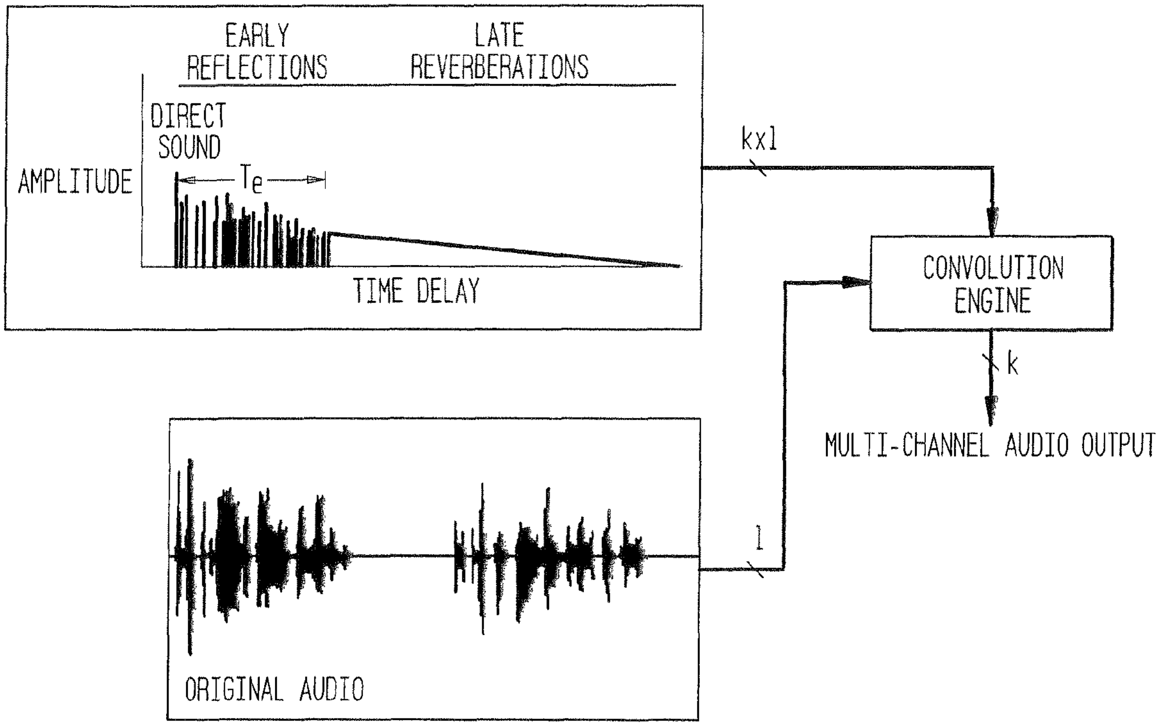
FIG. 11 illustrates auralization of an original audio signal using a source receiver impulse response computed to represent various reverberation paths.

FIG. 9 illustrates an exemplary partial beam tree structure created during priority driven beam tracing. In this example, the source location is cell D, i.e., M(S) is D, and a receiver avatar is located in cell B of the spatial division illustrated in FIGS. 5A and 5B. Initially, a root node 500 is created for the beam tree and is expanded by considering each boundary polygon k, j, m, u, n, and l. As shown in FIG. 9, polygons k, j, m, n, and l will create a reflection beam that will stay in cell D. These reflection beams are respectively stored as beam tree nodes 510, 520, 530, 550, and 560 for the partial beam tree structure shown in FIG. 9. As being a transmissive polygon of the boundary of cell D, polygon u will result in a transmission beam from cell D to cell E, which will be stored as node 540 in the partial beam tree of FIG. 9. To guide the priority-driven beam tracing, beam tree nodes 510, 520, 530, 540, 550, and 560 will be ranked according to their respective priority values before any of these nodes are expanded. The beam tree node with the first ranked priority value, e.g., the smallest value of (g(B)+h(B)) will be expanded by considering each of the boundary polygons for the corresponding cell. In this way, significant propagation paths will be traced first to enable rapid computations of the important reverberation paths between the source S and the receiver R. Any insignificant paths, i.e., "late" arriving paths, may be statistically represented in the impulse-response generated by the auralization unit 50. As shown in the example of FIG. 9, significant propagation paths will be followed to the receiver location cell B.

Bi-Directional Beam Tracing

According to another embodiment of the present invention, the beam tracing unit 30 utilizes a bi-directional beam tracing technique to combine beam trees that are being simultaneously constructed for different source locations to efficiently find reverberation paths between each pair of avatar locations. The primary motivation for the bi-directional beam tracing approach of this embodiment of the present invention is that the computational complexity of beam tracing grows exponentially with increasing reflections. Consequently, tracing one set of beams up to k reflections typically takes far longer than tracing two sets of beams up to k/2 reflections. A second motivation for bi-directional beam tracing is that, for implementation in a multi-user system, the beam tracing unit 30 must find reverberation paths between each pair of avatars. In this situation, a unidirectional approach will be inherently redundant because beams must be traced fully from all except one avatar location to insure that reverberation paths are found between all avatar pairs. In other words, almost every reverberation path will be traced twice, once in each direction. Utilizing a bi-directional approach, the beam tracing unit 30 can avoid this redundant work by combining beams traced from one avatar location with beams traced from another avatar location to find the same reverberation paths more efficiently. To achieve this computational savings, the beam tracing unit 30 must be able to find beam tree leaf nodes of a beam tree being constructed for a first avatar that may be connected to beam tree leaf nodes of a beam tree being constructed for a second avatar. This aspect of the bi-directional beam tracing technique of the present invention will be described in detail below.

Figure 12:
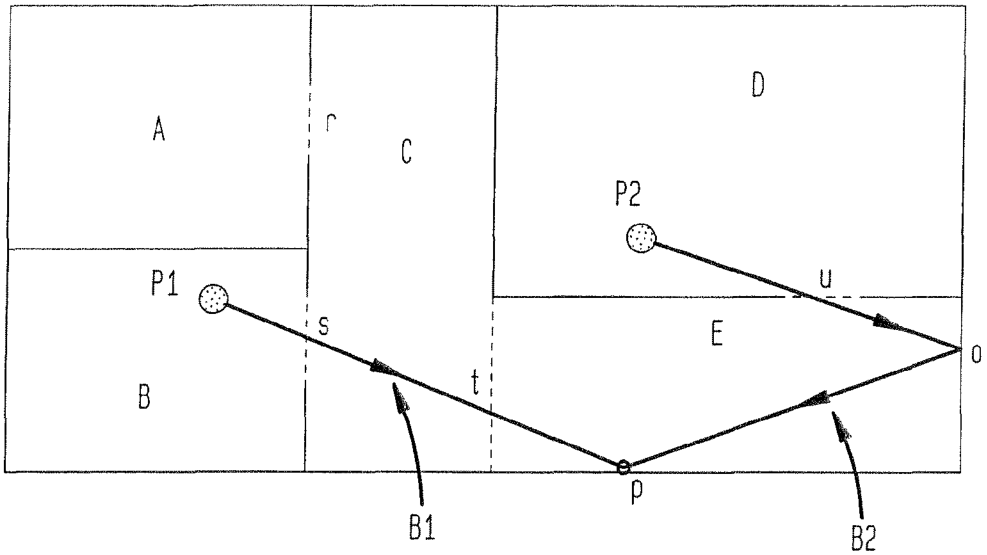
FIG. 12 illustrates overlapping reverberation paths between avatar locations to demonstrate the principles of bi-directional beam tracing.

FIG. 12 illustrates the general concept of bi-directional beam tracing by showing that a first beam B1 originating from a first avatar P1 overlaps with a second beam B2 originating from a second avatar P2. Thus, beam tree nodes constructed for P1 and P2 may be combined at a node that represents beam intersection with polygon p to avoid redundant beam tracing. An important aspect of the bi-directional beam tracing technique of the present invention is the criteria used by the beam tracing unit 30 to determine which beams, $B_1$ and $B_2$, traced independently from avatar locations, $P_1$ and $P_2$, combine to represent viable reverberation paths. These criteria are based on the following observations that apply to propagation models comprising specular reflections, diffuse reflections, transmissions, and diffractions over locally reacting surfaces. FIGS. 14A-14E illustrate a set of conditions, or criteria, that the beam tracing unit 30 applies to determine when beams combine to represent viable reverberation paths between two avatars P1 and P2.

Condition A: There is a viable reverberation path if $B_1$ contains $P_2$ (see FIG. 14A).

Condition B: There are (usually an infinite number of) viable reverberation paths containing a diffuse reflection at surface S if both $B_1$ and $B_2$ intersect the same region of S (see FIG. 14B).

Condition C: There is a viable reverberation path containing a straight-line transmission through surface S if: 1) both $B_1$ and $B_2$ intersect the same region of S, 2) $B_1$ intersects the virtual source of $B_2$, and 3) $B_2$ intersects the virtual source of $B_1$ (see FIG. 14C).

Condition D: There is a viable reverberation path containing a specular reflection at surface S if: 1) both $B_1$ and $B_2$ intersect the same region of S, 2) $B_1$ intersects the mirrored virtual source of $B_2$, and 3) $B_2$ intersects the mirrored virtual source of $B_1$ (see FIG. 14D).

Condition E: There is a reverberation path containing a diffraction at an edge E if: 1) $B_1$ and $B_2$ both intersect the same region of E (see FIG. 14E).

To accelerate evaluating these conditions, the beam tracing unit 30 constructs a list of beam tree nodes intersecting each cell and boundary of the spatial subdivision as the beams are traced. The beam tracing unit 30 traverses these lists to efficiently determine which pairs of beam tree nodes potentially combine to represent viable reverberation paths, avoiding consideration of all n(n−1)/2 pair wise combinations of traced beams. First, for each pair of beam tree nodes considered, the beam tracing unit 30 checks if both nodes are either the root or a leaf node of their respective beam trees. If not, the pair can be ignored as the pair of nodes surely represent a reverberation path that will be found by another pair of nodes. On the other hand, if the beam tracing unit 30 determines that both nodes are either the root or a leaf node of their respective beam trees, the beam tracing unit checks the beams intersecting each cell containing an avatar to determine whether Condition A is satisfied. Furthermore, the beam tracing unit 30 checks pairs of beams intersecting the same transmissive polygon to determine whether Condition C is satisfied. Still further, the beam tracing unit checks pairs of beams intersecting the same reflecting polygon to determine if Condition D is satisfied. For considering diffuse reflection and diffraction events, the beam tracing unit 30 determines whether the pair of beams intersect the same region of a reflecting polygon to determine if Condition B is satisfied and considers whether the pair of beams intersects a diffractive edge between two boundary polygons to determine whether Condition E is satisfied.

Finally, the beam tracing unit 30 selects the first node meeting one of the applied criteria to compute an underestimating distance heuristic to another avatar location, which can be used to aid early termination when searching for early reflection paths in an integrated bi-directional and priority-driven beam tracing algorithm.

As compared to unidirectional beam tracing methods, the main advantage of the above-described bi-directional approach is that paths with up to R reflections can be found by combining two beam trees representing up to $R_1$ and $R_2$ reflections, respectively, where $R_1+R_2-1=R$. Since $c^{R1}+c^{R2}<<c^R$ for most c, fewer beams must be traced (where c is the branching factor of the beam tree).

Figure 13:
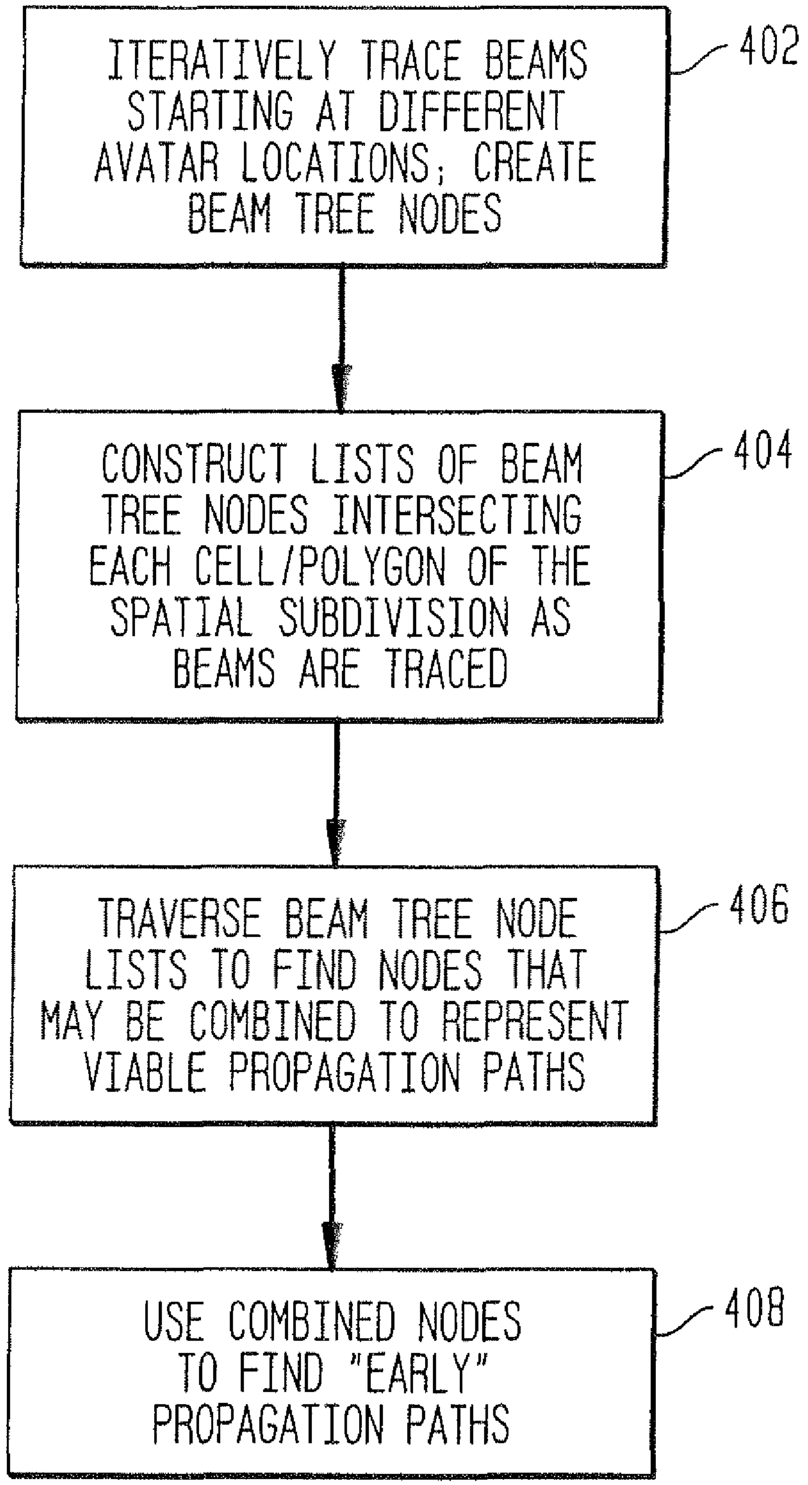
FIG. 13 is a flowchart for the bi-directional beam tracing technique according to an embodiment of the present invention.
Figure 14A:
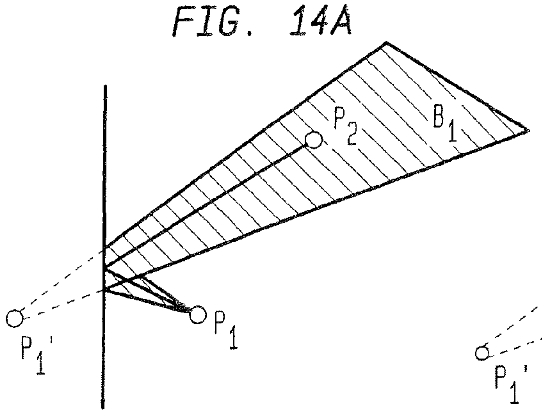
FIGS. 14A-14E illustrate various conditions for combing bi-directional beams according to the bi-directional beam tracing technique of the present invention.
Figure 14B:
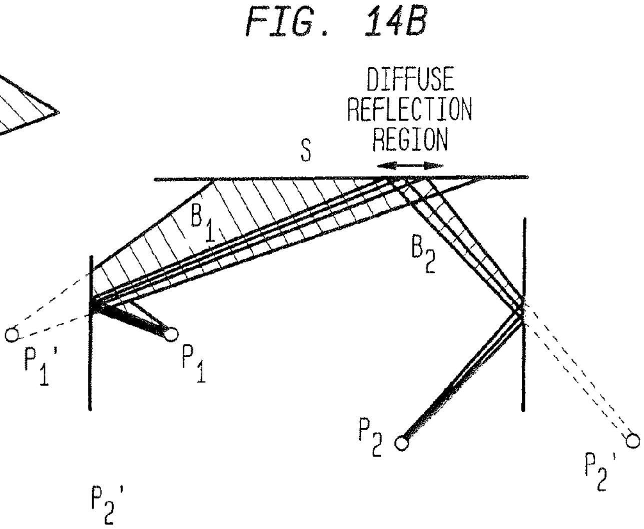
Figure 14C:
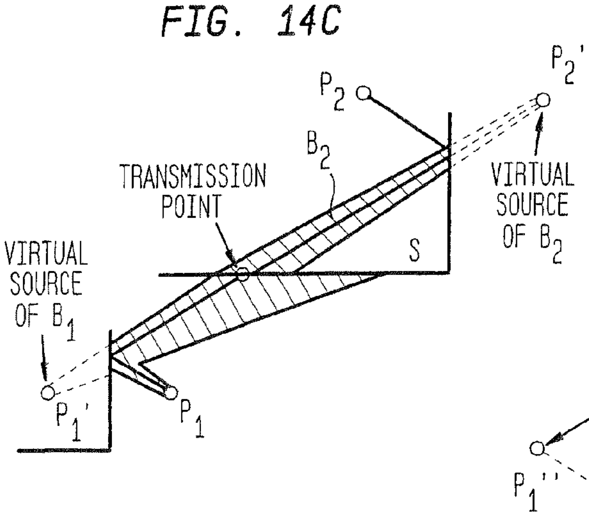
Figure 14D:
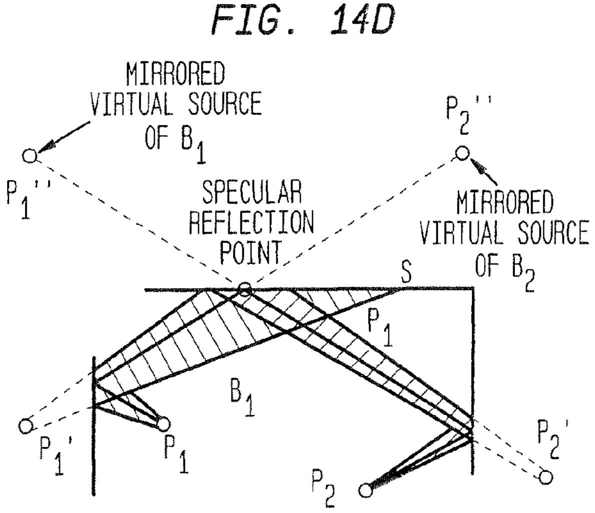
Figure 14E:
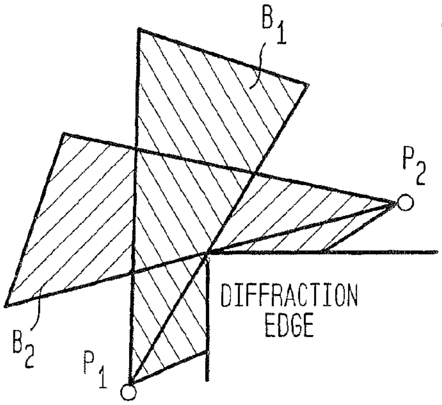

FIG. 13 illustrates a flow diagram for bi-directional beam tracing. Initially, the beam tracing unit 30 iteratively traces beams at different avatar locations so that a beam tree structure is created for each audio source (step 402). A list of beam tree nodes is constructed for nodes intersecting each cell/polygon of the spatial subdivision as beams are Laced (step 404). These beam tree nodes lists created in step 404 are traversed to find nodes that may be combined, for example based on the above-described criteria, to represent viable propagation paths (step 406). Finally, suitable nodes from multiple beam trees are combined to find "early" propagation paths (step 408).

Figure 15:
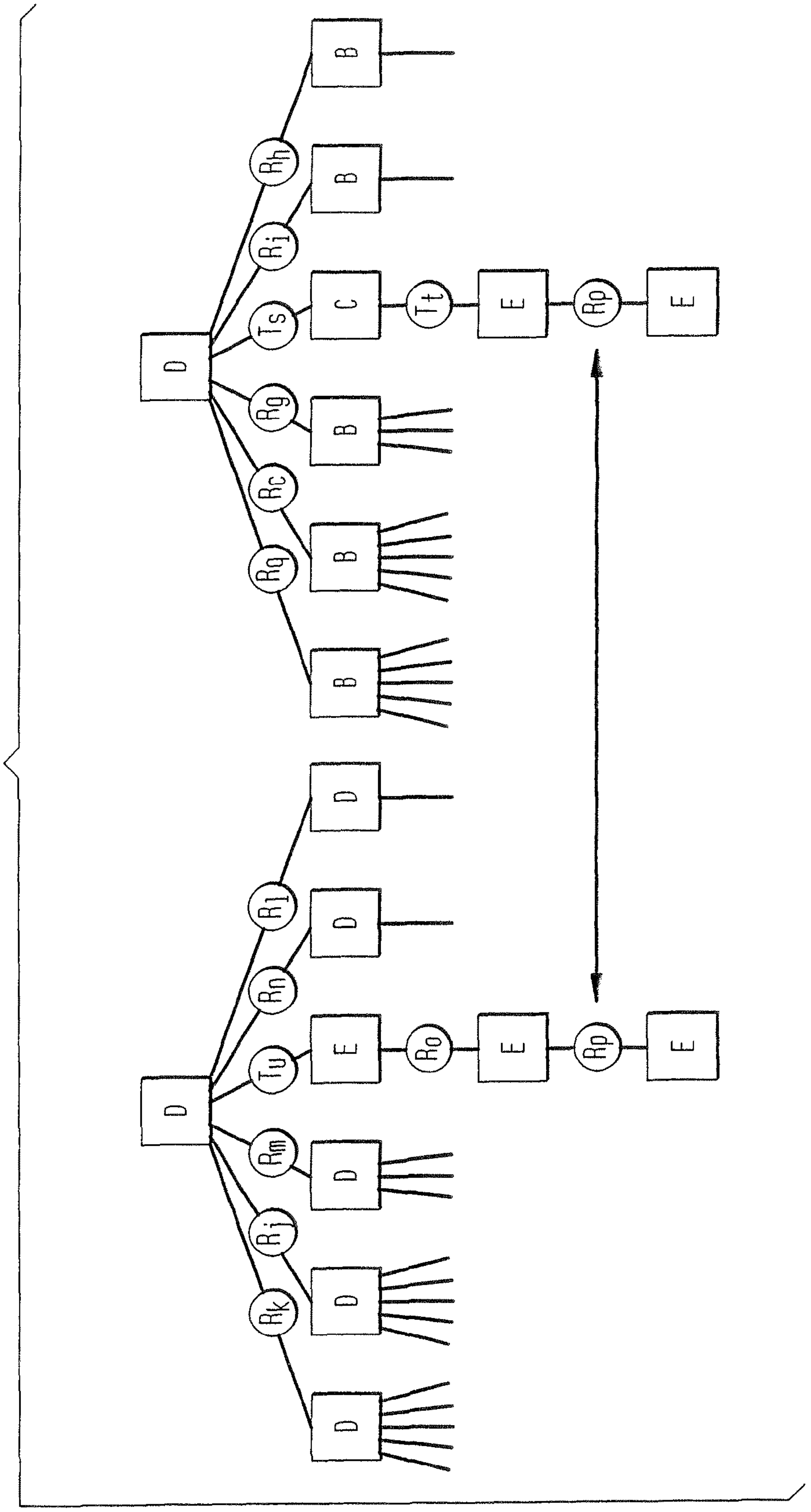
FIG. 15 illustrates two beam tree structures (partial) that are linked at a node to avoid redundant beam tracing.

FIG. 15 illustrates an example of beam tree combining in which a beam tree for propagation paths originating from cell D in the spatial division of FIGS. 5A and 5B are represented in a first beam tree and propagation from an avatar in cell B is constructed. It can be seen that the first beam tree structure and the second beam tree structure are combined where beams traced for each beam tree impinge polygon p (Condition D) to avoid redundant beam tracing between cells D and B.

It should be recognized that the beam tracing unit 30 may generate each beam tree structure used during bi-directional beam tracing using the priority-driven technique described above to further accelerate beam tracing.

Path Generation

To spatialize sound in the virtual environment, for example in a multi-user system, users navigate simulated observers (receivers) and sources through a virtual environment and reverberation paths from each source point, S, to each receiver point, R, can be generated in real-time via lookup in the beam tree data structure described above. Path generation has previously been described by Funkhouser et al. in "*A Beam Tracing Approach to Acoustic Modeling for Interactive Virtual Environments*," SIGGRAPH 98, pp. 21-32. First, the path generation unit 40 accesses the beam tree data structure, the cell adjacency graph, and the receiver position/direction information. Next, the cell containing the receiver point R is found by a logarithmic-time search of the BSP.

The path generation unit 40 checks each beam tree node, T, associated with the cell containing the receiver point R to see whether beam data is stored for node T that contains the receiver point R. If so, a viable path from the source point S to the receiver point R has been found, and the ancestors of node T in the beam tree explicitly encode the set of propagation events through the boundaries of the spatial subdivision that sound must traverse to travel from the source point S to the receiver point R along this path (more generally, to any point inside the beam stored with T).

A filter response (representing, for example, the absorption and scattering resulting from beam intersection with cell boundaries) for the corresponding reverberation path can be derived quickly from the data stored with the beam tree node, T, and its ancestors in the beam tree.

Auralization

To utilize the results from the path generation unit 40 in an interactive virtual environment, the auralization unit 50 simulates the effect of a sound source S (or a set of 1 sound sources) at the receiver location (i.e., auralization). Principles of auralization have also been described by Funkhouser et al. in "*A Beam Tracing Approach to Acoustic Modeling for Interactive Virtual Environments*," SIGGRAPH 98, pp. 21-32. Since acoustic waves are phase dependent (i.e., the delays created by wave propagation along different paths alter the sound recreated at the receiver location), time propagation delays caused along reverberation paths must be taken into account to achieve realistic auralization. Once a set of reverberation paths from a source point to the receiver location has been computed, the auralization unit 50 generates a source-receiver impulse response by adding the collective impulse responses along the time axis for each distinct path from source to receiver. In the simplified case of modeling each path to account for simple delay and attenuation, the aggregate impulse response is the sum of weighted impulses along the time axis, where the weight represents the attenuation due to spherical wave spreading and wall absorption. The delay Δ associated with each pulse is given by:

$$\Delta=L/C, \tag{1}$$

where L is the length of the corresponding reverberation path, and C is the speed of sound. Since the pulse is attenuated by every reflection and dispersion, the amplitude, a, of each pulse is given by:

$$\alpha=A/L, \tag{2}$$

where A is the product of all the frequency-independent reflectivity and transmission coefficients for each of the reflecting and transmitting surfaces along the corresponding reverberation path.

It will be evident that more complex filter responses for viable reverberation paths may be generated to account for such factors as frequency-dependent absorption, angle-dependent absorption, and scattering (i.e., diffraction and diffuse reflection). Although such complex filter responses require additional computations, the computational savings achieved by the present path generation method allow such complex filter responses to be utilized without sacrificing interactive processing rates.

At the receiver, multi-channel (e.g., stereo, or surround-sound) impulse responses are computed by spatially filtering the individual paths into a multitude of prescribed directions. For the simple case of binaural reproduction (i.e., separate impulse responses for the left and right ears), the paths are weighted by two spatial filters that may, for example, have a cardioid directivity (CD) function given by:

$$CD_{1,2}=\tfrac{1}{2}(1+/-\cos(_\theta)), \tag{3}$$

where θ is the angle of arrival of the pulse with respect to the normal vector pointing out of the ear. This approximation to actual head scatter and diffraction is similar to the standard two-point stereo microphone technique used in high fidelity audio recording. Finally, each source audio signal is convolved with the multi-channel impulse responses to produce spatialized audio signals. Separate, concurrently executing processors may be used to convolve the computed multi-channel impulse responses with the original audio signal, or parts of these impulse responses with the original audio signal, or for later computations of the combined total multi-channel impulse responses. In order to support real-time auralization, transfer of the impulse responses from the path generation processor to the convolution processor may utilize double buffers synchronized by a semaphore. Each new pair of impulse responses is loaded by the path generation processor into a "back buffer" as the convolution processor continues to access the current impulse responses stored in the "front buffer." A semaphore is thus used to synchronize the concurrently executing processors as the front and back buffer are switched.

Computer Implementation

Figure 16:
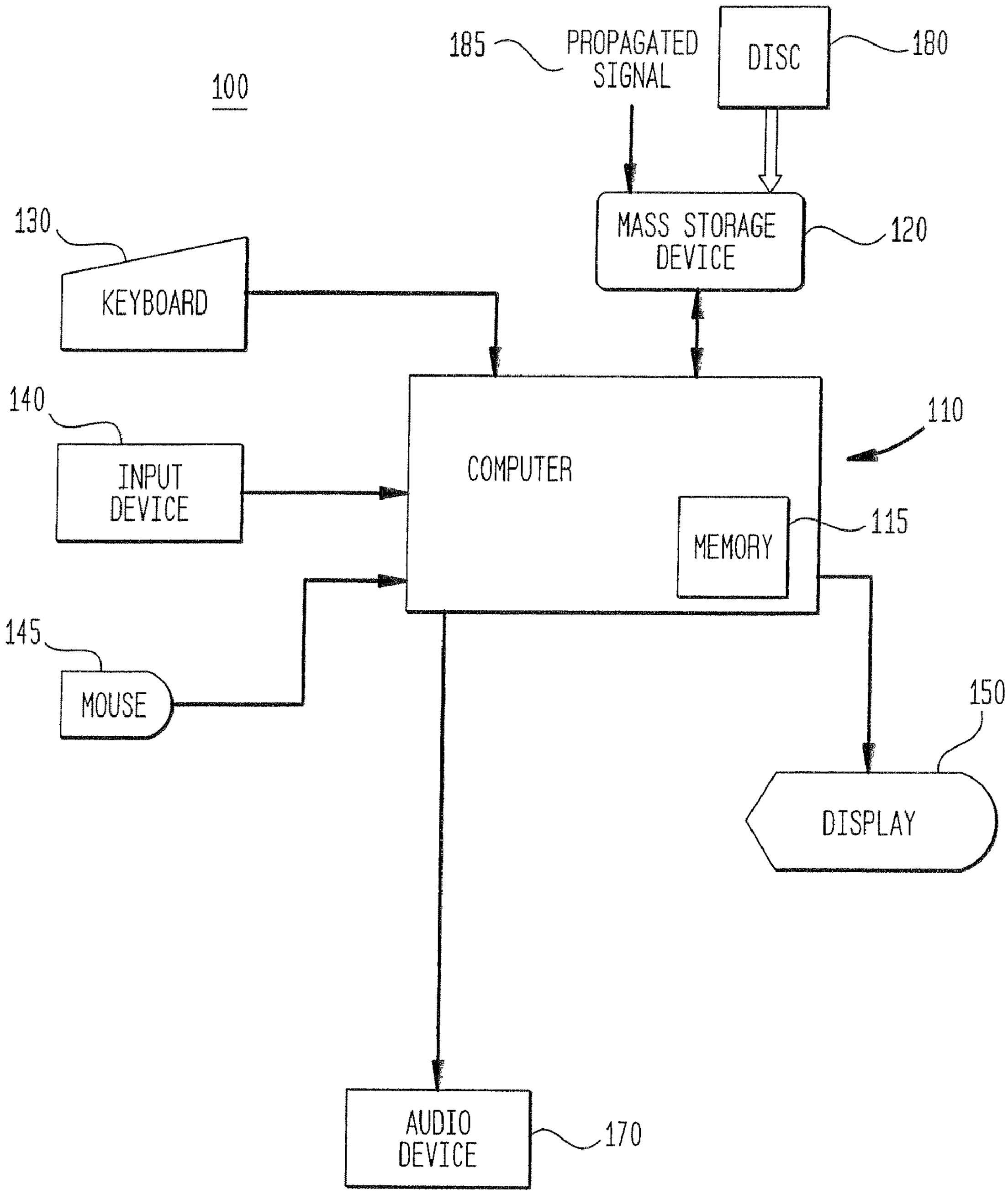
FIG. 16 is a block diagram of a computer system for implementing acoustic modeling in accordance with the present invention.

A computer system suitable for implementing the acoustic modeling and auralization method according to the present invention is shown in the block diagram of FIG. 16. The computer 110 is preferably part of a computer system 100.

To allow human interaction with the computer 110, the computer system includes a keyboard 130 and a mouse 145. The mouse 134 may be used to move the receiver location during an interactive modeling application.

Because the invention may be applied in immersive virtual environments such as 3D video games, the computer system 100 also includes an input device 140 (e.g., a joystick) which allows the user to input updated orthogonal coordinate values representing a receiver location. For outputting visualized modeling results, the computer system 100 also includes a display 150 such as a cathode ray tube or a flat panel display. Furthermore, to achieve auralization, the computer system 100 includes a sound board/card and D/A converter (not shown) and an audio output device 170 such as a speaker system.

The computer system 100 also includes a mass storage device 120, which may be, for example, a hard disk, floppy disc, optical disc, etc. The mass storage device may be used to store a computer program that enables the acoustic modeling method to be executed when loaded in the computer 110. As an alternative, the mass storage device 120 may be a network connection or off-line storage that supplies a program to the computer. More particularly, a program embodying the method of the present invention may be loaded from the mass storage device 120 into the internal memory 115 of the computer 110. The result is that the general purpose computer 110 is transformed into a special purpose machine that implements the acoustic modeling method of the present invention.

Figure 17:
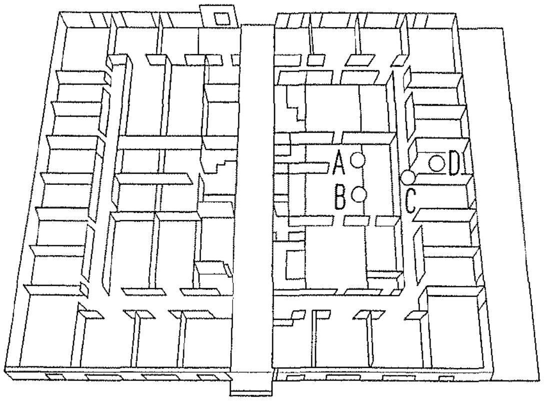
FIG. 17 illustrates a test model used to demonstrate the effectiveness of the beam tracing techniques of the present invention.

A computer-readable medium, such as the disc 180 in FIG. 17 may be used to load computer-readable code into the mass storage device 120, which may then be transferred to the computer 110. Alternatively, the computer-readable code may be provided to the mass storage device 120 as part of an externally supplied propagation signal 185 (e.g., received over a communication line through a modem or ISDN connection). In this way, the computer 110 may be instructed to perform the inventive acoustic modeling method disclosed herein.

Computation Results

In one specific implementation, the accelerated beam tracing techniques described above were implemented in C++ and integrated them into a distributed virtual environment (DVE) system supporting communication between multiple users in a virtual environment with spatialized sound. This implementation was designed to support specular reflections and transmissions in 3D polygonal environments, and to run on PCs and SGIs connected by a 100 Mb/s TCP network.

The system uses a client-server design, whereby each client provides an immersive audio/visual interface to the shared virtual environment from the perspective of one avatar. As the avatar "moves" through the environment, possibly under interactive user control, images and sounds representing the virtual environment from the avatar's simulated viewpoint are updated on the client's computer in real-time. Communication between remote users on different clients is possible via network connections to the server(s). Any client can send messages to the server(s) describing updates to the environment (e.g., the position and orientation of avatars) and the sounds occurring in the environment (e.g., voices associated with avatars). When a server receives these messages, it processes them to determine which updates are relevant to which clients, it spatializes the sounds for all avatars with the beam tracing algorithms described in the preceding sections, and it sends appropriate messages with updates and spatialized audio streams back to the clients so that they may update their audio/visual displays. To evaluate the effectiveness of our new beam tracing methods in the context of this system, a series of experiments was conducted with a single server spatializing sounds on an SGI Onyx2 with four 195 MHz R10000 processors. In each experiment, different beam tracing algorithms were used to compute specular reflection paths from a source point (labeled 'A') to each of the three receiver points labeled 'B', 'C' and 'D' in the 3D model shown in FIG. 17.

Priority-Driven Beam Tracing Results

The relative benefits and costs of priority-driven beam tracing were analyzed by running a series of tests using the three different beam tracing techniques based on different search methods for traversing the cell adjacency graph and different termination criteria: (1) DF-R: Depth-first search up to a user-specified maximum number of reflections; (2) DF-L: Depth-first search up to a user-specified maximum path length; and (3) P: Priority-driven search (the algorithm of the present invention). In each set of tests, all early specular reflection paths ($T_e$=20 ms) were calculated from a source point (labeled 'A') to one of three receiver points (labeled 'B,' 'C,' and 'D') in the 3D model shown in FIG. 17. The depth-first search algorithms, DF-R and DF-L, were aided by oracles in these tests, as the termination criteria were chosen manually to match the exact maximum number of reflections, R, and the maximum path length, L, respectively, of known early reflection paths, which were predetermined in earlier tests. In contrast, the priority-driven algorithm, P, was given no hints, and it used only the dynamic termination criteria described above.

Figure 18:
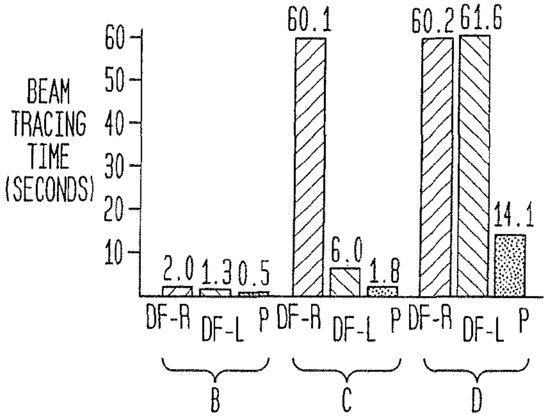
FIG. 18 illustrates a series of bar charts showing experimental beam tracing times using priority-driven beam tracing.

The bar chart in FIG. 18 shows the wall-clock times (in seconds) required to find all early specular reflection paths for each combination of the three receiver points and the three beam tracing algorithms. Although all three algorithms found exactly the same set of early reflection paths from the source to each receiver, the computation times for the priority-driven approach (the far right-side bars) were between 2.6 and 4.3 times less than the next best. The reason is that the priority-driven algorithm considers beams representing the earliest paths first and terminates according to a metric utilizing knowledge of the receiver location, and thus it avoids computing most of the useless beams that travel long distances from the source and/or stray far from the receiver location.

The relative value of the priority-driven approach depends on the geometric properties of the environment. For instance, all early reflection paths to the receiver point 'B,' which was placed in the same room as the source, required less than or equal to 3 specular reflections and the longest path was only 623 inches. These relatively tight termination criteria were able to bound the complexities of the depth first search algorithms, so the speedup of the priority-driven algorithms is only around 2.6× over the next best. In contrast, for receiver point 'D,' some early reflection paths required up to 7 specular reflections, and the longest early reflection path was 1046 inches. In this case, the priority-driven algorithm is far more efficient (speedup is 4.3×) as it directs the beam tracing search towards the receiver point almost immediately, rather than computing beams extending radially in all directions.

Bi-Directional Beam Tracing Results

To test the relative benefits and cost of the bi-directional beam tracing technique described above, a series of tests were run with comparable unidirectional and bi-directional beam tracing implementations on an SGI workstation with a 195 MHz R10000 processor.

In each set of tests, all specular reflection paths from a source point (labeled 'A') to one of three receiver points (labeled 'B,' 'C,' and 'D') were computed up to a specified maximum number of reflections ('R') in the 3D model shown in FIG. 17. The unidirectional algorithm constructed a single beam tree containing all paths with up to R specular reflections from the source point, and then it reported a specular reflection path for each beam containing the specified receiver point. In contrast, the bi-directional algorithm constructed two beams trees for each source-receiver pair, the first containing beams up to R/2+1 specular reflections from the receiver. The two beam trees were combined to find all Rth-order specular reflections. The goal of the experiment was to determine which algorithm takes less total computation time.

Table 1 contains statistics collected during these tests. From left to right, the first column (labeled 'P') lists which receiver point was used. The second column (labeled 'R') indicates the maximum number of specular reflections computed. Then, for both the unidirectional and bi-directional algorithms, there are three columns which show the times (in seconds) required to compute the beam trees ("Bean Time"), find the reflection paths ("Paths Time"), and the sum of these two ("Total Time"). Finally, the last column (labeled "Speedup") lists the total time for unidirectional beam tracing algorithm as a ratio over the total time.

TABLE 1

| | | Unidirectional | | | Bidirectional | | | |
|---|---|---|---|---|---|---|---|---|
| P | R | Beam Time | Path Time | Total Time | Beam Time | Path Time | Total Time | Speed Up |
| B | 3 | 2.02 | 0.01 | 2.03 | 1.04 | 0.03 | 1.07 | 1.9 |
| | 4 | 5.79 | 0.03 | 5.82 | 2.55 | 0.10 | 2.65 | 2.3 |
| | 5 | 15.01 | 0.07 | 15.08 | 4.23 | 0.50 | 4.73 | 3.5 |
| | 6 | 31.53 | 0.14 | 31.66 | 8.02 | 1.31 | 9.33 | 3.9 |
| | 7 | 60.26 | 0.24 | 60.50 | 11.95 | 4.43 | 16.39 | 5.0 |
| | 8 | 100.82 | 0.41 | 101.22 | 21.12 | 9.52 | 30.64 | 4.8 |
| C | 3 | 2.03 | 0.01 | 2.03 | 0.96 | 0.01 | 0.98 | 2.1 |
| | 4 | 5.81 | 0.01 | 5.82 | 2.49 | 0.04 | 2.54 | 2.3 |
| | 5 | 14.83 | 0.02 | 14.86 | 3.92 | 0.20 | 4.12 | 3.8 |
| | 6 | 31.38 | 0.05 | 31.42 | 7.82 | 0.54 | 8.37 | 4.0 |
| | 7 | 60.82 | 0.08 | 60.90 | 11.23 | 1.97 | 13.20 | 5.4 |
| | 8 | 100.89 | 0.14 | 101.03 | 20.56 | 4.13 | 24.69 | 4.9 |
| D | 3 | 2.03 | 0.00 | 2.03 | 0.62 | 0.01 | 0.62 | 3.3 |
| | 4 | 5.81 | 0.01 | 5.81 | 2.17 | 0.03 | 2.20 | 2.7 |
| | 5 | 14.94 | 0.01 | 14.95 | 2.47 | 0.12 | 2.59 | 6.0 |
| | 6 | 31.88 | 0.02 | 31.90 | 6.24 | 0.29 | 6.53 | 5.1 |
| | 7 | 60.31 | 0.04 | 60.35 | 7.10 | 0.92 | 8.02 | 8.5 |
| | 8 | 100.68 | 0.06 | 100.75 | 16.27 | 1.83 | 18.10 | 6.2 |

Comparing the "Bean Times" in Table 1, we see that the bi-directional algorithm spends significantly less time tracing beams than the unidirectional algorithm. This is because the bi-directional approach constructs beam trees with less depth, thereby avoiding the worst part of the exponential growth.

CONCLUSION

As described above, the priority-driven and bi-directional beam tracing techniques of the present invention result in significant computational savings, thereby facilitating rapid modeling of significant reverberation paths between avatars in a virtual environment, such as a multi-user system. It should be recognized that the above-described priority-driven and bi-directional beam tracing techniques may be incorporated in an acoustic modeling system that performs amortized beam tracing (where beams are traced between regions of space instead of individual points so that the same beam tree can be reused during avatar movement) and time-critical multi-processing (where multiple processors are used and computational resources are dynamically allocated to perform the highest priority beam tracing computations in a timely manner). Amortized beam tracing and time-critical multiprocessing are described in detail in the concurrently filed application titled "*Acoustic Modeling Apparatus and Method for Virtual Environments*." It should be apparent to those skilled in the art that various modifications and applications of the present invention are contemplated. which may be realized without departing from the spirit and scope of the present invention.

What is claimed is:

1. A method of modeling coherent wave propagation in a spatial environment comprising:

computing wave propagation paths from a source to other regions in said spatial environment in priority order; and generating at least one reverberation path between said source and a receiver based on at least one computed wave propagation path.

2. The method according to claim 1, wherein said method models acoustic reverberations between an audio source and a receiver location.

3. The method according to claim 1, wherein said computing step traces propagation paths through said spatial environment via traversal of a cell adjacency graph that represents neighbor relationships between regions of said spatial environment.

4. The method according to claim 1, wherein said source is moving.

5. The method according to claim 1, wherein said receiver is moving.

6. The method according to claim 1, further comprising:

creating a impulse response for said reverberation path; and convolving said impulse response with a source signal to generate a spatialized output signal.

7. The method according to claim 1, wherein said computed wave propagation paths are stored in a data structure that encodes reverberation paths between said source and a plurality of receivers in said spatial environment.

8. The method according to claim 1, wherein said method models acoustic reverberations paths between avatar locations of a multi-user virtual environment system.

9. The method according to claim 7, wherein said data structure encodes reverberation paths that arrive early at a receiver.

10. A method of modeling coherent wave propagation in a spatial environment comprising:

constructing a data structure for each of a plurality of sources by bi-directionally tracing beams between pairs of said plurality of sources in said spatial environment; and computing a filter response for at least one path between said pairs in said plurality of sources based on the constructed data structures.

11. The method according to claim 10, wherein said method models acoustic reverberations between an audio source and a receiver location.

12. The method according to claim 10, wherein said data structure is a beam tree that encodes reverberation paths between a source and other regions in said spatial environment.

13. The method according to claim 10, wherein said constructing step traces beams through said spatial environment via traversal of a cell adjacency graph that represents neighbor relationships between regions of said spatial environment.

14. Then method according to claim 10, wherein said step of constructing a data structure for each of a plurality of sources computes reverberation paths between said plurality of sources by combing beam trees traced independently from different sources.

15. The method according to claim 10, wherein said source is a region representing an area in which a source is anticipated to be located during a sequence of movements.

16. An apparatus for modeling coherent wave propagation in a spatial environment comprising:

means for computing wave propagation paths from a source to other regions in said spatial environment in priority order; and means for computing a reverberation path between said source and a receiver based on at least one computed wave propagation path.

17. The apparatus according to claim 16, wherein said apparatus models acoustic reverberations between an audio source and a receiver location.

18. The apparatus according to claim 16, wherein said means for computing traces propagation paths through said spatial environment via traversal of a cell adjacency graph that represents neighbor relationships between regions of said spatial environment.

19. The apparatus according to claim 16, wherein said source is moving.

20. The apparatus according to claim 16, wherein said receiver is moving.

21. The apparatus according to claim 16, further comprising:

means for creating an impulse response corresponding to said created reverberation path; and means for convolving said impulse response with a source signal to generate a spatialized output signal.

22. The apparatus according to claim 16, wherein said computed wave propagation paths are stored in a data structure that encodes reverberation paths between said source and a plurality of receivers in said spatial environment.

23. The apparatus according to claim 16, wherein said apparatus models acoustic reverberations paths between avatar locations of a multi-user virtual environment system.

24. The apparatus according to claim 22, wherein said data structure encodes reverberation paths that arrive early at a receiver.

25. An apparatus for modeling coherent wave propagation in a spatial environment comprising:

means for constructing a data structure for each of a plurality of sources by bi-directionally tracing beams between pairs of said plurality of sources in said spatial environment; and means for computing a filter response for a least one path between two sources in said plurality of sources based on a constructed beam tree data structures.

26. The apparatus according to claim 25, wherein said apparatus models acoustic reverberations between an audio source and a receiver location.

27. The apparatus according to claim 25, wherein said data structure is a beam tree that encodes reverberation paths between a source and other regions in said spatial environment.

28. The apparatus according to claim 25, wherein said means for constructing traced beams through said spatial environment via traversal of a cell adjacency graph that represents neighbor relationships between regions of said spatial environment.

29. The apparatus according to claim 27, wherein said means for constructing a data structure for each of a plurality of sources computes reverberation paths between said plurality or sources by combining beam trees traced independently from different sources.

30. The apparatus according to claim 25, wherein each source is a region representing an area where a moving source is anticipated to be located during a sequence of movements.

* * * * *